United States Patent
Fukuda

(10) Patent No.: US 11,802,763 B2
(45) Date of Patent: Oct. 31, 2023

(54) PATTERN MEASUREMENT DEVICE AND COMPUTER PROGRAM

(71) Applicant: Hitachi High-Technologies Corporation, Tokyo (JP)

(72) Inventor: Hiroshi Fukuda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/326,397

(22) PCT Filed: Sep. 1, 2016

(86) PCT No.: PCT/JP2016/075588
§ 371 (c)(1),
(2) Date: Feb. 19, 2019

(87) PCT Pub. No.: WO2018/042581
PCT Pub. Date: Mar. 8, 2018

(65) Prior Publication Data
US 2019/0186910 A1 Jun. 20, 2019

(51) Int. Cl.
*G01B 15/04* (2006.01)
*G03F 7/00* (2006.01)
*G01N 23/2251* (2018.01)

(52) U.S. Cl.
CPC ......... *G01B 15/04* (2013.01); *G01N 23/2251* (2013.01); *G03F 7/70625* (2013.01); *G01B 2210/56* (2013.01)

(58) Field of Classification Search
CPC . G01N 23/00–2273; G01N 2223/6116; G01N 2223/418; G01N 23/2251; G03F 7/70625; G01B 15/04; G01B 2210/56

(Continued)

(56) References Cited

U.S. PATENT DOCUMENTS 6,795,573 B2 * 9/2004 Yoshida ........... G01N 21/95607
382/146
6,979,829 B2 * 12/2005 Calvert ................. A61L 2/0035
250/472.1

(Continued)

FOREIGN PATENT DOCUMENTS

JP 2005-331495 A 12/2005
JP 2006-215020 A 8/2006

OTHER PUBLICATIONS

International Search Report (PCT/ISA/210) issued in PCT Application No. PCT/JP2016/075588 dated Dec. 6, 2016 with English translation (two (2) pages).

(Continued)

*Primary Examiner* — David E Smith
(74) *Attorney, Agent, or Firm* — Crowell & Moring LLP

(57) ABSTRACT

The purpose of the present invention is to provide a pattern measurement device that achieves both high-throughput measurement using a small number of measurements and high-accuracy measurement that uses statistical processing. To accomplish this purpose, the present invention proposes a pattern measurement device provided with a calculation processing device that acquires the signal intensity distribution for a plurality of positions included in a scanning region from a signal obtained through beam scanning; substitutes, into a probability density function having the signal intensity distribution as a random variable and the coordinates within the scanning region as a variable, a signal intensity distribution based on the signal obtained from the beam scanning; and for the plurality of positions within the scanning region, sets the coordinates within the scanning region at which the probability density function is at the maximum or at which prescribed conditions are met as the edge position.

11 Claims, 7 Drawing Sheets

(58) Field of Classification Search
USPC .......................................................... 250/306
See application file for complete search history.

(56) References Cited

U.S. PATENT DOCUMENTS

| | | | | |
|---|---|---|---|---|
| 7,049,589 B2* | 5/2006 | Yamaguchi | ............ | G01B 15/08 |
| | | | | 250/492.3 |
| 7,230,723 B2* | 6/2007 | Yamaguchi | ........ | G01N 23/2251 |
| | | | | 250/310 |
| 7,430,052 B2* | 9/2008 | Shyu | ...................... | G01B 21/02 |
| | | | | 356/600 |
| 7,930,123 B2* | 4/2011 | Ikeda | ............... | G05B 19/41875 |
| | | | | 702/83 |
| 10,724,856 B2* | 7/2020 | Yamaguchi | ............ | H01J 37/222 |
| 2006/0145076 A1 | 7/2006 | Yamaguchi et al. | | |

OTHER PUBLICATIONS

Japanese-language Written Opinion (PCT/ISA/237) issued in PCT Application No. PCT/JP2016/075588 dated Dec. 6, 2016 (three (3) pages).

Ullah et al., "Overlay Improvement Using Legendre/Zernike Model-Based Overlay Corrections and Monitoring with Interpolated Metric", Proc. of SPIE, 2015, vol. 9424 942420-10, (14 pages).

Wakui, "Bayesian Statistics and MCMC Method", 2009, Nippon Jitsugyo Publishing, including partial English translation (eight (8) pages).

\* cited by examiner

[FIG. 1]
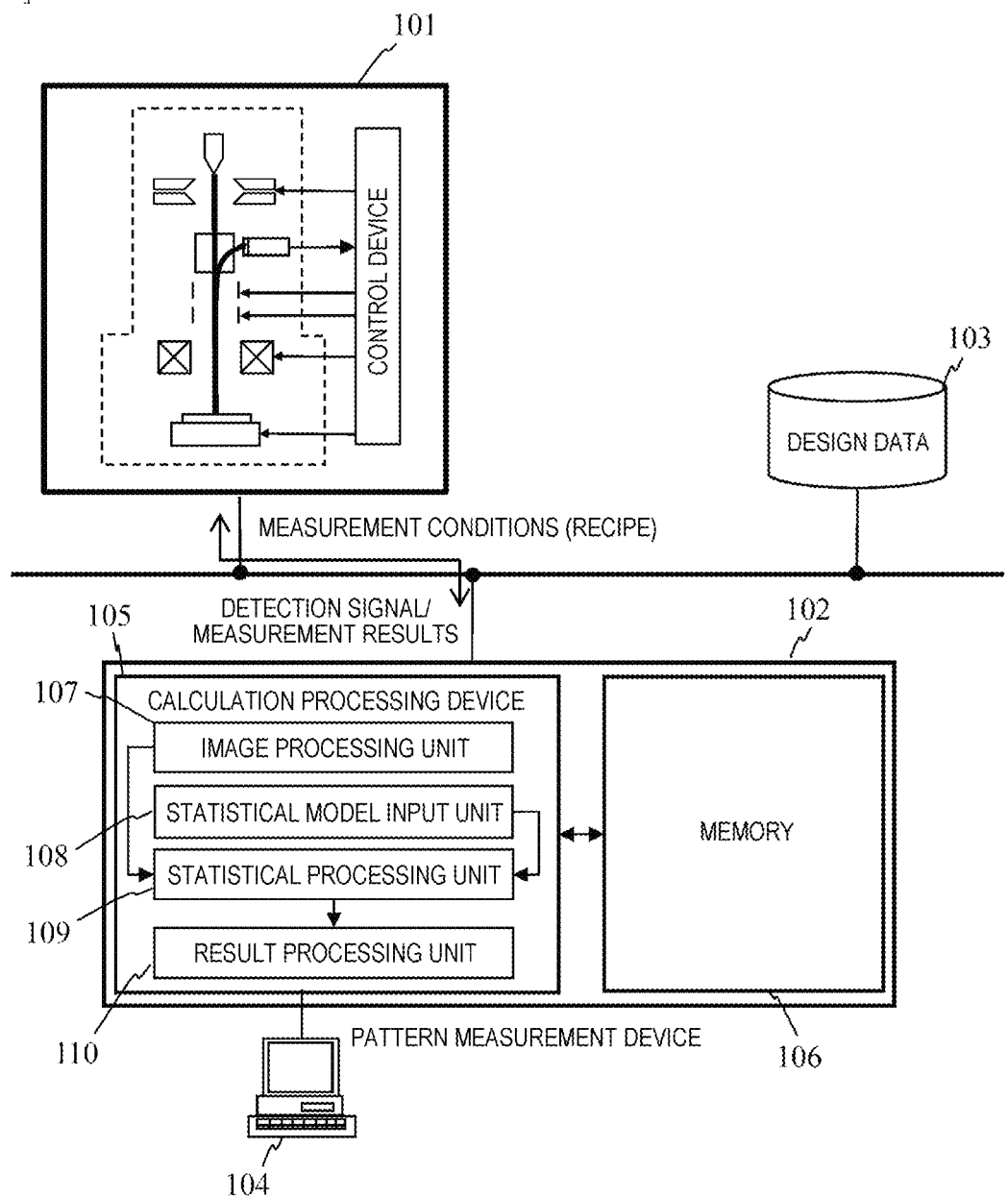

[FIG. 2]
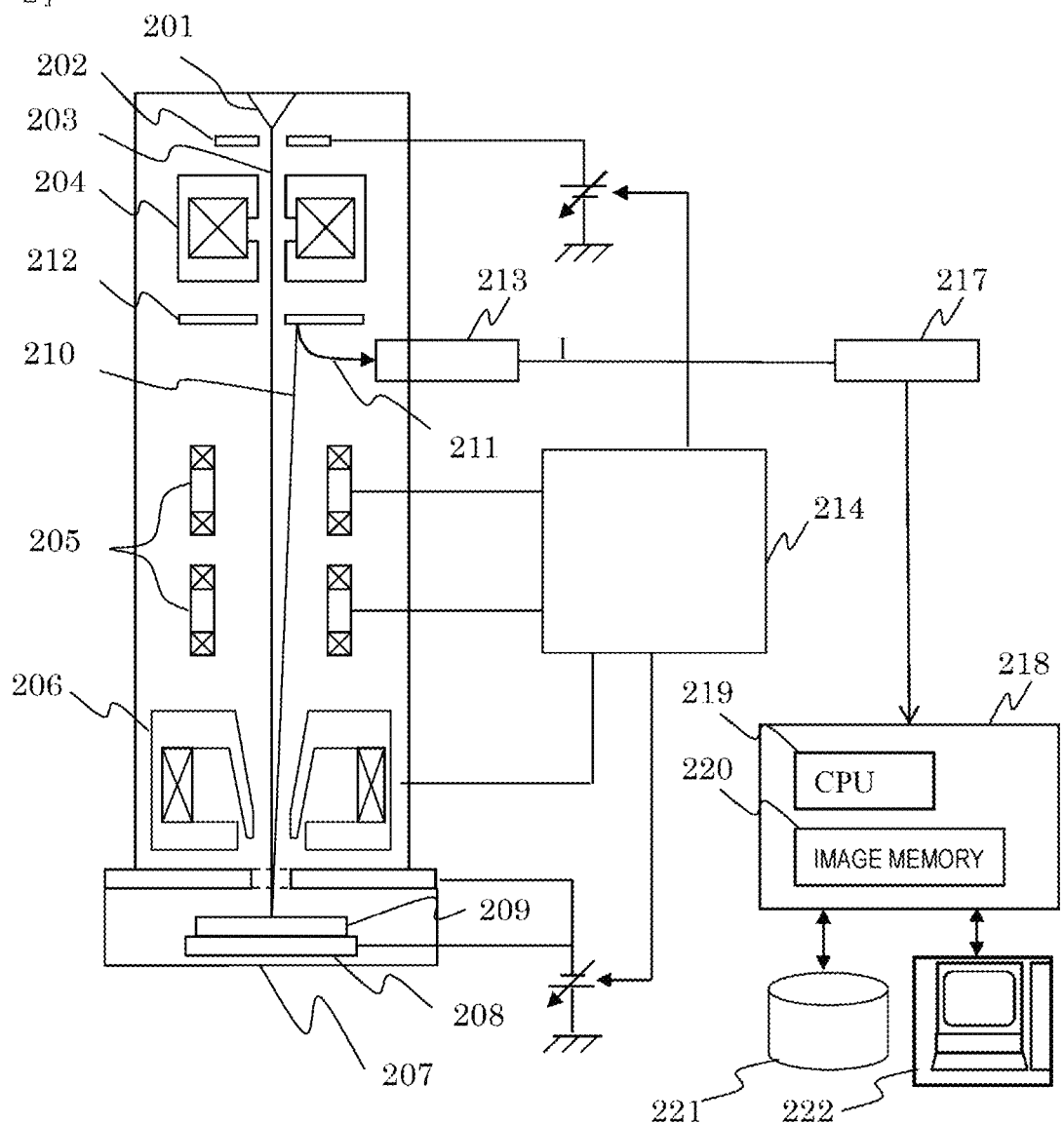

[FIG. 3]
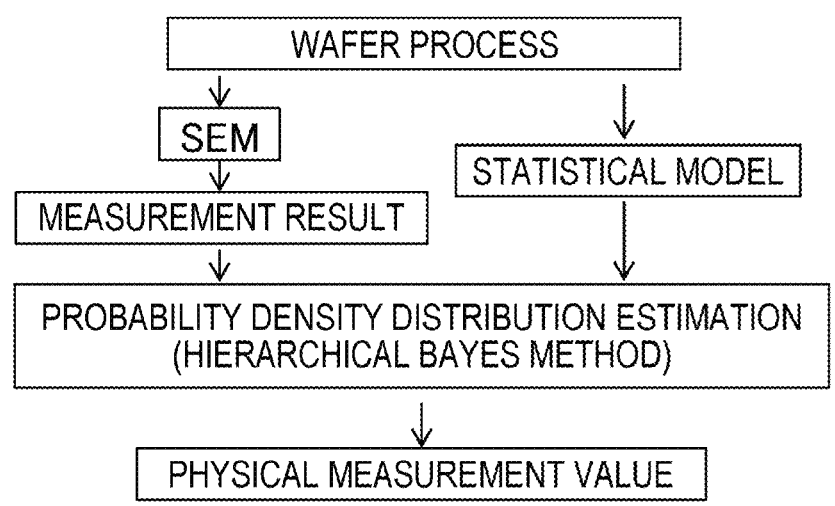

[FIG. 4]
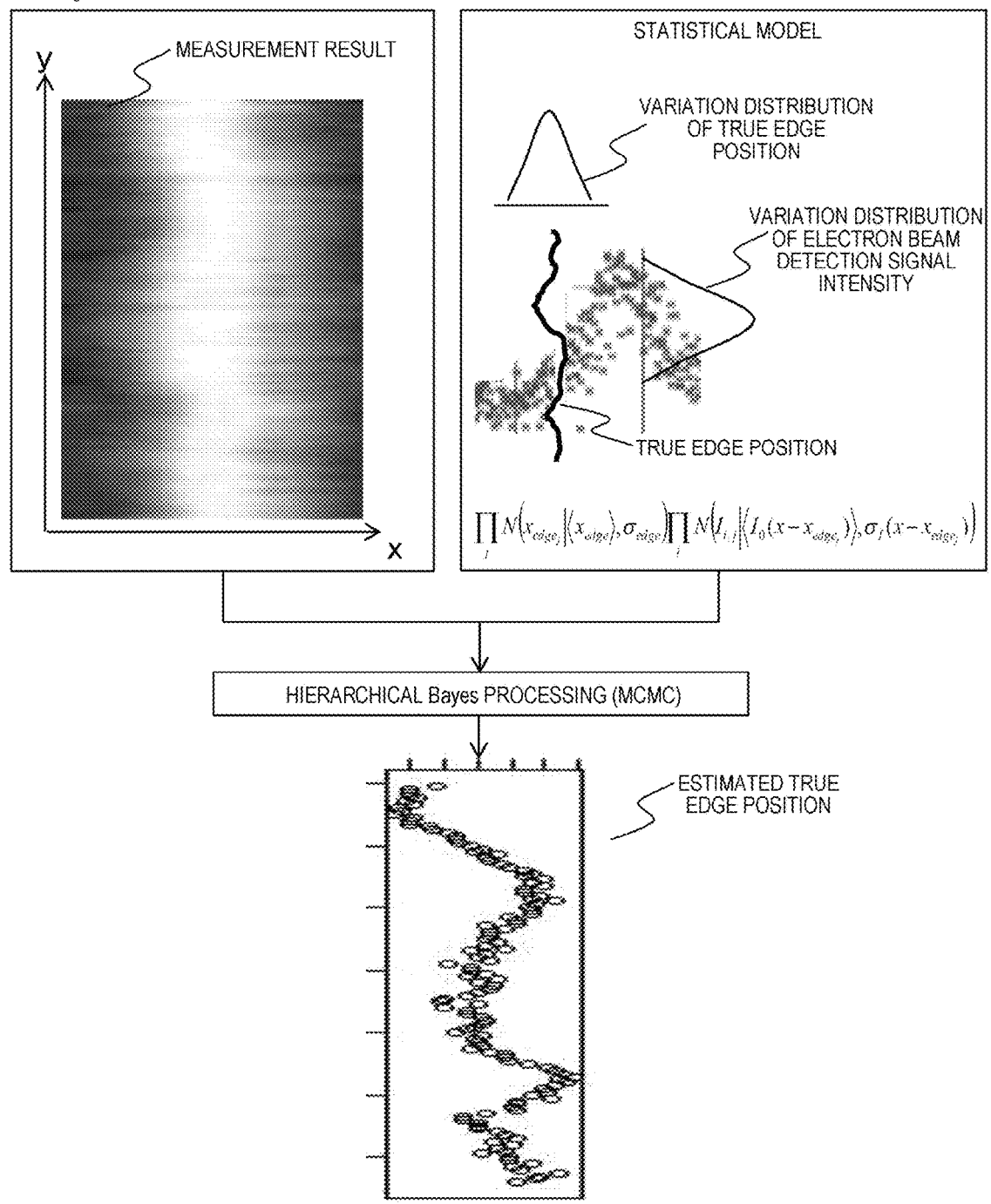

MEASUREMENT POINT

WAFER IN-PLANE DISTRIBUTION OF CD

WAFER IN-PLANE DISTRIBUTION OF LCDU

WAFER IN-PLANE DISTRIBUTION OF HISTOGRAM OF CD MEASUREMENT RESULT

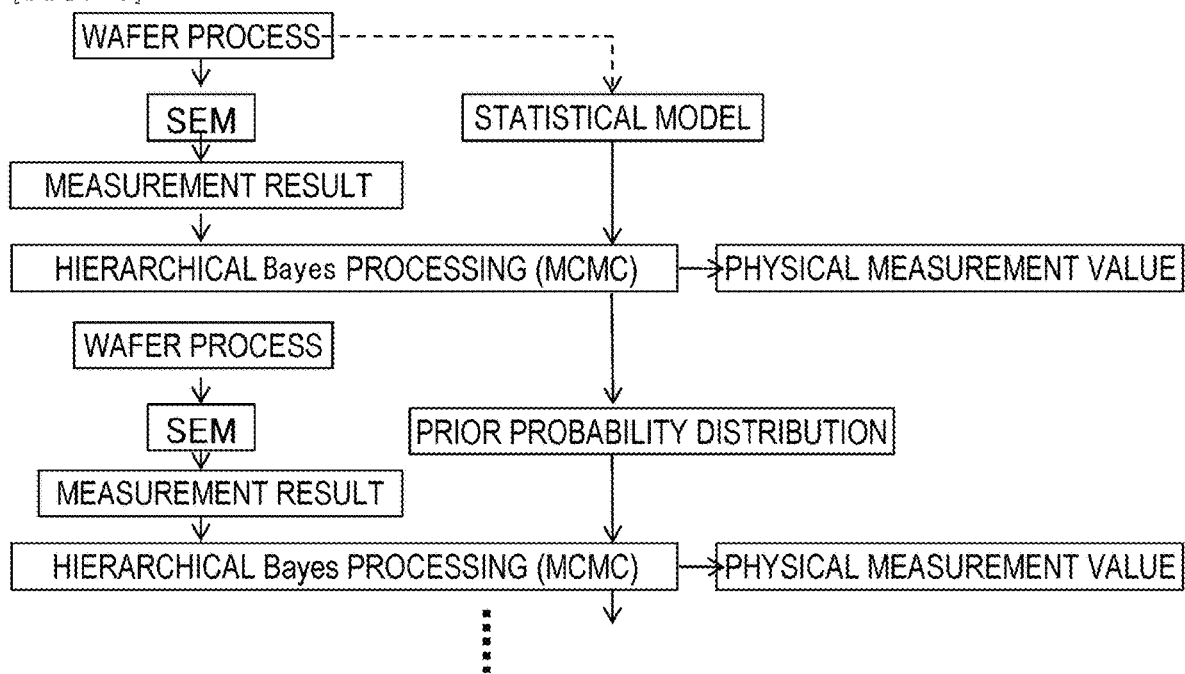

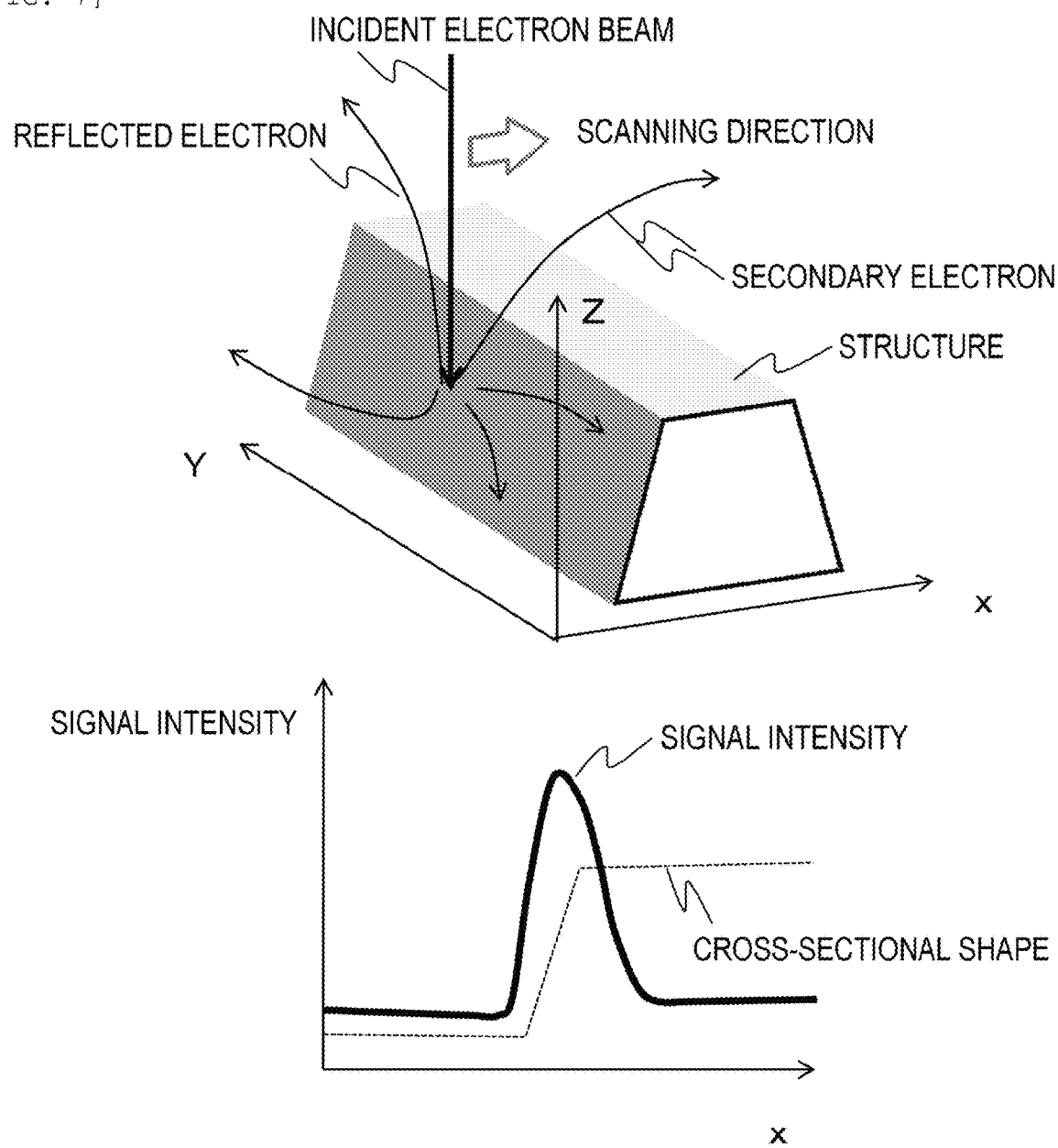
[FIG. 7]

PATTERN MEASUREMENT DEVICE AND COMPUTER PROGRAM

TECHNICAL FIELD

The present invention relates to a device and a computer program for measuring a feature amount of a pattern formed on a sample using a signal obtained by an imaging device such as an electron microscope or the like, and more particularly, to a pattern measurement device and a computer program for obtaining a feature amount using a probability density function wherein the feature amount of a pattern obtained by an electron microscope or the like is set as a random variable.

BACKGROUND ART

Along with the high integration of semiconductor devices, the importance of process management based on measurement and inspection using a scanning electron microscope (SEM) capable of visualizing a pattern having a line width of several tens of nm is increasing. PTL 1 describes a Critical Dimension-SEM (CD-SEM) that measures a line edge roughness (LER) appearing at an edge of a pattern. In PTL 1, it is described that the roughness of a specific frequency component is extracted through frequency analysis on a fluctuation component at the edge portion, and the roughness is set as a feature amount.

Furthermore, in order to secure the production yield of the semiconductor integrated circuit (LSI), it is necessary to control the characteristic distribution on a wafer. In this regard, process control for measuring in-plane characteristics and feeding the results back to a manufacturing apparatus is performed in a wafer manufacturing process. Regarding statistical calculation of feedback information from the measurement result to the manufacturing apparatus, studies are being conducted in fields of exposure matching, for example, as described in NPL 1.

Meanwhile, according to the recent development of the Internet and cloud servers, it is now possible to analyze big data, and statistical analysis on complicated phenomena, such as a Bayesian estimation method, an MCMC method, and the like is being put into practical use. These statistical analysis methods are described in, for example, NPL 2.

CITATION LIST

Patent Literature

PTL 1: JP-A-2006-215020 (corresponding U.S. Pat. No. 7,230,723)

Non-Patent Literature

NPL 1: Overlay Improvement using Legendre-Zernike Model-based overlay corrections and monitoring with interpolated metric (Proc. of SPIE Vol. 9424 942420-10 (2015))
NPL 2: "Bayesian Statistics as a Tool" by Yoshiyuki Wakui, published by Nippon Jitsugyo Publishing (2009)

SUMMARY OF INVENTION

Technical Problem

So far, a pattern measurement technology using a CD-SEM or the like as described in PTL 1 has been aimed at obtaining a measurement result close to an actual feature amount (roughness evaluation value or the like) of a pattern. Meanwhile, a measurement value obtained by a CD-SEM or the like varies depending on various factors. For example, even if a pattern sampled for measurement is accurately measured, it is merely accurate measurement of a pattern to be sampled, and even if process control of a manufacturing apparatus is performed based on the measurement result, it may be unable to perform proper control. Also, in case of a scanning electron microscope for detecting electrons obtained based on scanning of electron beams, for example, an emitting direction or the like of electrons emitted from a sample is random and varies for each measurement, and thus even if the same patterns are measured, it is not always possible to form the exact same signal waveforms, and as a result, there is a possibility that a measurement result for performing appropriate process control cannot be obtained.

In order to suppress such variations due to various factors and to obtain measurement results for proper process control, it is considered that statistical processing of a plurality of measurement results is performed to obtain measurement results that do not depend on various variation factors, and a large number of measurement results need to be obtained to obtain highly accurate measurement results. However, since CD-SEMs used for measurement in a mass production process of semiconductors are particularly required to have high throughput, it is difficult to achieve compatibility with highly accurate measurements requiring a large number of measurements. NPL 1 and NPL 2 do not refer to a pattern measurement device that achieves both high throughput and high-accuracy measurement based on a small number of measurement results.

Hereinafter, a pattern measurement device and a computer program for achieving both high-throughput measurement with a small number of measurements and high-accuracy measurement using statistical processing are proposed.

Solution to Problem

According to an aspect for achieving the above object, there is provided a pattern measurement device including a calculation processing device that acquires signal intensity distribution for a plurality of positions included in a scanning region from a signal obtained through beam scanning, substitutes, into a probability density function having the signal intensity distribution as a random variable and coordinates within the scanning region as a variable, the signal intensity distribution based on the signal obtained through the beam scanning, and for the plurality of positions within the scanning region, sets the coordinates within the scanning region at which the probability density function is at the maximum or at which prescribed conditions are met as an edge position.

According to another aspect for achieving the above object, there is provided a pattern measurement device including a calculation processing device for measuring feature amounts of a plurality of points on a sample from a signal obtained through beam scanning, wherein the calculation processing device sets a statistical model including a probability density function that includes a distribution model of a feature amount using a function of a hyper parameter and coordinates as a parameter and uses the feature amount as a random variable, substitutes the feature amount obtained through the measurement into the statistical model, calculates the hyper parameter at which the probability density function is at the maximum or at which prescribed conditions are met at the plurality of points, and calculates the distribution model at a plurality of positions based on setting of the obtained hyper parameter in the statistical model.

Advantageous Effects of Invention

According to the above configuration, it is possible to achieve both high-throughput measurement using a small number of measurements and high-accuracy measurement using statistical processing.

BRIEF DESCRIPTION OF DRAWINGS

FIG. 1 is a diagram illustrating an example of a semiconductor measurement system including an SEM.

FIG. 2 is a diagram illustrating an outline of a scanning electron microscope.

FIG. 3 is a flowchart illustrating processes of calculating a feature amount of a pattern using a detection signal by the SEM and a statistical model.

FIG. 4 is a diagram illustrating a process of estimating a true edge position using a detection signal by the SEM and a statistical model, and a display example of an estimation result thereof.

FIG. 6 is a flowchart illustrating processes of calculating a feature amount of a pattern using a detection signal by the SEM and a statistical model.

FIG. 7 is a diagram illustrating an example of a signal waveform obtained when a structure formed on a sample is irradiated with an electron beam.

DESCRIPTION OF EMBODIMENTS

Figure 5A:
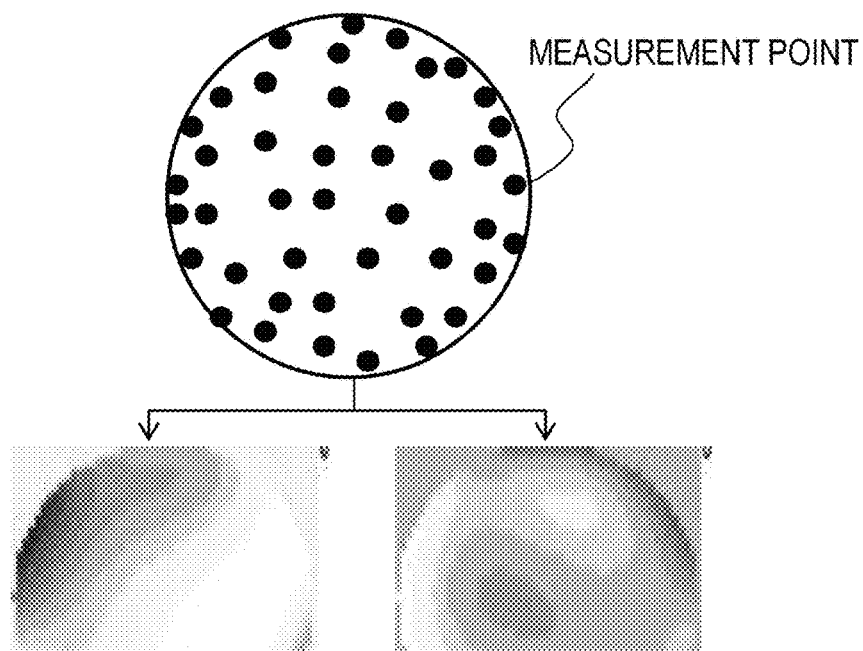
FIGS. 5A to 5C are diagrams illustrating a process of obtaining in-plane distribution of a measurement value (CD value) and in-plane distribution of LCDU using a detection signal by the SEM and a statistical model, and display examples of the in-plane distributions.

In a semiconductor integrated circuit (LSI), high performance and high integration are advanced according to miniaturization of a circuit pattern. At present, a line width of a minimum circuit pattern of the most advanced LSI is less than or equal to 20 nm (nanometer), and in order to secure performance of the LSI, it is necessary to strictly manage these circuit dimensions (for example, with the accuracy in which an allowable value of a variation change in dimensions is equal to or less than 10% to 20% of a design value). The circuit dimensions are preferably measured using an SEM. FIG. 2 is a diagram illustrating an outline of an SEM. An electron beam 3 is extracted from an electron source 201 by a lead electrode 202 and accelerated by an acceleration electrode that is not illustrated. The accelerated electron beam 203 is narrowed by a condenser lens 204 as a form of a focusing lens, and then deflected by a scanning deflector 205. As a result, the electron beam 203 scans a sample 209 one-dimensionally or two-dimensionally. The electron beam 203 incident on the sample 209 is decelerated by a negative voltage applied to an electrode embedded in a sample stage 208 and focused at the same time due to a lens effect of an objective lens 206, so that a surface of the sample 209 is irradiated with the electron beam.

Electrons 210 (secondary electrons, backscattered electrons, and the like) are emitted from an irradiated portion of the sample 209. The emitted electrons 210 are accelerated in a direction of the electron source 201 by an acceleration effect based on the negative voltage applied to the electrode embedded in the sample stage 208. The accelerated electrons 210 strike a conversion electrode 212 to generate secondary electrons 211. The secondary electrons 211 emitted from the conversion electrode 212 are captured by a detector 213, and an output I of the detector 213 is changed due to the amount of the captured secondary electrons. Luminance of a display device that is not illustrated is changed according to the change of the output I. For example, if a two-dimensional image is to be formed, an image of a scanning region is formed by synchronizing a deflection signal to the scanning deflector 205 and the output I of the deflector 213. In the scanning electron microscope of FIG. 2, an electron detector 215 for detecting secondary electrons 216 is disposed in the objective lens 206.

In the configuration example of FIG. 2, an example is illustrated in which the electrons 210 emitted from the sample 209 are detected after being converted into the secondary electrons 211 at the conversion electrode 212, but obviously, the configuration is not limited thereto, and for example, a configuration in which a detection surface of an electron multiplier tube or a detector is arranged on a path of accelerated electrons may be adopted. A control device 214 supplies a control signal necessary for each optical element of the SEM according to an operation program called an imaging recipe for controlling the SEM.

Next, a signal detected by the detector 213 is converted into a digital signal by an A/D converter 217 and transmitted to an image processing unit 218.

The image processing unit 218 includes an image memory storage medium 220 for temporarily storing a digital image and a CPU 219 for calculating feature amounts (a dimension value of a line or hole width, a roughness index value, an index value indicating a pattern shape, an area value of a pattern, a pixel position as an edge position, and the like) from an image in the image memory. For example, edge position information is calculated by thinning processing of a white band included in the image, and calculating a center position of the white band as the edge position.

Further, a storage medium 221 is provided for storing a measurement value of each pattern, a luminance value of each pixel, and the like. An overall control is performed by a workstation 222. A necessary operation of a device, confirmation of a detection result, or the like, may be realized by a graphical user interface (hereinafter, referred to as GUI). Also, the image memory is configured to store an output signal (a signal proportional to an amount of electrons emitted from the sample) of the detector in synchronization with a scanning signal supplied to the scanning deflector 205, in a corresponding address (x, y) on the memory. Also, the image processing unit 218 operates as a calculation processing device that generates a line profile from the luminance values stored in the memory, determines the edge position using a threshold method or the like, and measures the dimension between edges.

The SEM that performs dimension measurement based on such line profile acquisition is called CD-SEM, and is used to measure various feature amounts in addition to line width measurement of a semiconductor circuit. For example, unevenness called line edge roughness exists at the edge of the circuit pattern, which causes the circuit performance to change. The CD-SEM can be used to measure the LER.

In a manufacturing process of an electronic component, such as a semiconductor integrated circuit, a high-frequency element, or the like, a pattern of an electronic component, such as a transistor, a memory element, or the like or of a circuit or the like connecting the elements is formed on a substrate such as a semiconductor or the like, or a thin film on the substrate using lithography and etching techniques. In a most advanced device where miniaturization is advanced, the dimensions of the above each element and circuit reach 10 nm, and are expected to be further reduced in the future. Since the performance of the electronic component largely depends on a planar shape of the element and circuit, the planar shape is generally required to be formed with the accuracy of about ⅓ of a design dimension of the pattern.

However, due to various factors, in reality, a deviation occurs between a design pattern and a pattern of an element and circuit actually manufactured. Such a deviation may be quantitatively handled by measuring EPE (Edge Placement Error), i.e. the deviation between a position of an edge of the pattern of the element or circuit actually manufactured and a position of an edge where the pattern should correctly be. Factors that cause EPE are classified into the following three categories.

The three categories are (1) a deviation of a pattern average dimension, a change in a dimension that is thickened or thinned in overall, (2) a deviation of pattern average position, an overall position deviation, and (3) a local change of a pattern edge or pattern dimension.

(1) is caused by thinning/thickening of a resist pattern transferred by an exposure device and side etching, and may be corrected by adjusting exposure conditions, such as an exposure amount/focus position, and the like, or process conditions, such as etching and the like. (2) is caused by, for example, misalignment between a base pattern and a mask transfer image by an exposure device, and may be corrected by adjusting the alignment of the exposure device. It is assumed that (3) is caused by a random or local edge position change that is difficult to be controlled by the above, for example, a stochastic variation of a chemical reaction or dissolution phenomenon in materials in an intermediate region of exposure intensity near an edge of a projected image. Since the amplitude of the variation reflects, for example, the width of an intermediate exposure range=the sharpness of an exposure profile (defocusing conditions or the like), the amplitude varies according to effective projection image contrast.

The deviations of (1) to (3) vary due to spatial and temporal variations, and the influence on the element performance depends on a relationship between a spatial period of the variation and the element dimension. When the variation period is smaller than the element dimension, the variation deteriorates the element performance itself. On the other hand, when the variation period is larger than the element dimension, the variation becomes the element performance deviation. Generally, the variation spatial period of (3) is smaller than (1) and (2), but with the miniaturization of a pattern, an effect of (3) having the small spatial period on an element performance variation is being surfaced. In a so-called 7 nm node logical integrated circuit, approximate guidelines of (1) to (3) are considered to be about 1 nm, 2 nm, and 2 nm respectively.

Also, in recent years, a multi-patterning technique, such as SAQP (Self Aligned Quadruple Patterning), or the like, has been introduced in semiconductor manufacturing processes so as to form a minute pattern exceeding a resolution limitation of the exposure device. In such a patterning method called a side wall patterning, the quality of a side wall (sidewall) greatly affects the performance of a semiconductor device. In addition, since patterning is performed a plurality of times, factors causing dimension and positional deviation, such as the deposited thickness of the side wall or the like, are further complicated, but the factors of occurrence of EPE are also basically classified into (1) to (3) above. In any case, in order to suppress the deviation caused by the manufacturing processes and materials, it is necessary to accurately measure and correct a process condition/a device knob using a measuring device capable of highly accurate measurement, such as CD-SEM or the like.

Next, the spatial and temporal deviations of (1) to (3) include both a systematic variation and a random variation of the spatial distribution and a temporal change. (1) and (2) systematically change spatially/temporally by reflecting wafer in-plane distribution and chip in-plane distribution in the process condition/device state and the time change thereof, and at the same time, the process condition/device state varies randomly.

(3) is essentially stochastic, but the amplitude thereof also tends to be systematic spatially/temporally by reflecting the process condition/device state. In order to properly perform feedback control on an exposure device or other process devices, it is necessary to grasp both the tendency of spatial distribution or time change and the size of random variation. It is possible to provide proper feedback of manufacturing processes by separating each factor of the deviation or variation and measuring a feature amount.

The dimension of a certain pattern on a wafer is a definite value having a true value under the definition of a certain dimension. In the measurement using CD-SEM or the like, it is desirable to obtain a measurement value as close to the true value as possible. However, many patterns that may be measurement targets exist on a semiconductor wafer, and actual measurement is performed by sampling only a small portion of the many patterns. However, as described above, a feature amount of the measurement target varies. In this case, even if a true value is obtained by performing "perfect" measurement with respect to the true value of the sampled certain pattern, the obtained true value is for only one of the various patterns, and thus it may not be appropriate to control a process or device based thereon.

Furthermore, as described above, the measurement of a planar shape is performed using an electron microscope (SEM). In particular, in processes of manufacturing a semiconductor integrated circuit, a CD-SEM specialized in pattern dimension measurement on a wafer is often used. However, an observation result by the SEM is not deterministic as generally believed, but includes a variation due to a measurement error. Thus, it may not be necessarily appropriate to control the process or device based thereon.

Next, the following two representative examples will be described as specific examples of variations in SEM measurement.

(1) Variation in Edge Position

First, an edge position of a line pattern is to be measured by the SEM. As illustrated in FIG. 7, secondary electrons and backscattered electrons, which are obtained by scanning a focused electron beam such that a path of the electron beam is perpendicular to a longitudinal direction of an edge (a side wall of a structure), are detected. A signal intensity profile (line profile) is obtained by storing a detection signal in association with an irradiation position of the electron beam for obtaining the detection signal. Since signal intensity is the maximum when incident near the edge according to an edge effect, the edge position may be defined by, for example, setting an appropriate threshold value for relative signal intensity.

However, a measurement result obtained as such includes measurement reproducibility error. A main cause of the error is considered to be particle nature of electrons. In other words, when the secondary electrons or reflected electrons generated as the electron beam is incident on a sample are detected, each process of an incident position of electrons, a scattering/reflection direction inside the sample, generation of the secondary electrons, or the like, is a stochastic process, and as a result, the signal intensity profile is varied. Thus, the edge position obtained from the profile is also varied. Meanwhile, a true value itself at the edge position of the line pattern is also varied according to a scanning position in an edge direction. Accordingly, when the observed line edge position deviates from a correct position, it is unable to distinguish whether the deviation is deviation of the true value or deviation caused by a measurement error.

Also, the measurement error caused by the particle nature of the electrons is suppressed by increasing the number of incident electrons (an incident current or a total irradiation time (for example the number of frames)). However, in this case, the measurement target is damaged by the electrons, and a time required for the measurement is increased.

(2) Variation in Dimension Values and the Like

In general, a semiconductor LSI includes a huge number of identical design patterns on a wafer. For example, a memory LSI or a memory block of a logic LSI includes a large number of memory cells, and each memory cell needs to operate substantially equally within a predetermined variation range. The same is applied to standard cells constituting the logic LSI. In this regard, the identical design patterns need to be uniformly formed regardless of a position of the wafer and a manufacturing time, but due to various factors described in (1) to (3) above, deviation occurs in designs of patterns of elements and circuits that are actually manufactured. Accordingly, the spatial distribution of pattern dimensions/shapes and a time change thereof are important.

In the meantime, the spatial distribution of the pattern dimensions/shapes varies depending on a factor of deviation. Dimension variation caused by a wafer process, such as etching, deposition, or the like, has wafer level distribution reflecting in-plane distribution of a device state and process conditions, while variation distribution caused by an exposure device and a mask has chip level distribution. In addition, stochastic edge position variation caused by resist depends on lithography contrast and generates random dimension variation at a local region. Furthermore, there is dimension distribution reflecting a wafer history and a stochastic defect. (For example, a particle defect on a rear surface of a wafer causes variation in a wafer surface height, which leads to a dimension variation due to focus deviation and increase in resist-induced local dimension variation (LCDU) caused by contrast degradation.) As such, the pattern dimension distribution on the wafer shows a complicated distribution shape by overlapping with dimension variation/variation caused by various factors having different spatial periods. For appropriate feedback, it is necessary to separate distribution/variation of measured dimensions and the like according to factors.

In addition, these statistical measurements generally require a large number of measurements. However, highly accurate/highly reproducible measurements using an electron beam is low speed, and thus sufficient sampling is not performed within a practical time and statistically sufficient reliability is not obtained.

In an embodiment described below, a pattern feature amount measurement device that enables a highly reliable measurement result optimum for process control to be obtained with a small number of measurement samples considering statistical variations due to manufacturing variations and measurement variations, and a computer program for causing a calculation processing device to calculate a feature amount will be described.

In the embodiment described hereinafter, a physical amount (feature amount) to be measured, such as a dimension or the like, is treated as a random variable. In other words, when a signal intensity profile or a dimension/shape or an edge position to be measured from the signal intensity distribution is obtained by SEM, the signal intensity profile or the dimension/shape, or the like to be measured is treated as the random variable and a probability density function is obtained.

According to an examination result of the inventor, such a phenomenon may be described by a phenomenological statistical model based on a physical model or an experience model. Thus, as the probability density function, a statistical model based on a physical model or an experience model considering a variation due to various factors is assumed. Since the probability density function by such a statistical model generally has a very complicated form, a measurement result may be represented by a parameter or a hyper parameter of the probability density function.

Further, in an embodiment described below, the probability density function is obtained as a function of position or time. Here, the parameter or the hyper parameter may be the function of position or time. With respect to a change of a measurement target over time, time development by sequentially updating the probability density function according to the measurement result may be obtained.

One of general forms of the statistical model in an embodiment described below is that, when measurements are performed on n points at positions ri (i=1 to n) at a time t, the probability density function, in which an overall observation result {xi} is obtained with an observation result xi (i=1 to n) at each position as a random variable, is set to $\Pi_i [P(x_i, b(r_i, t))]$ (here, $\Pi_i$ represents a product regarding i). Here, b (ri, t) is a parameter or hyper parameter depending on a position and time. In particular, for example, the position may be a pixel position in an SEM image and the observation result may be detection intensity of each pixel, or the position may be a position on a wafer and the observation result may be a pattern dimension measured at each position. The probability density function, or the parameter or hyper parameter b(ri, t) that is most likely to provide the overall observation result is obtained.

The above statistical model for describing such a phenomenon with sufficient accuracy is generally complicated, and a plurality of parameters or hyper parameters included therein are often difficult to be identified from actual measurement values. Thus, in an embodiment described below, the probability density function is obtained by applying a hierarchical Bayes method, and further applying an MCMC (Markov Chain Monte Carlo) method that is a general solution. Specific procedures are as follows.

(1) Observing a measurement target (for example, a pattern dimension and an edge position) using a measurement device (for example, CD-SEM or the like) and storing a result, (2) defining a statistical model of the measurement target, (3) assuming a (hyper) parameter in the statistical model and obtaining a first probability density function, (4) calculating a first likelihood (likelihood=probability of obtaining an observation result in probability density function) for obtaining the observation result in the first probability density function, (5) calculating a second likelihood for obtaining the observation result similarly with respect to a second probability density function in which the (hyper) parameter is randomly perturbed, (6) updating the (hyper) parameter based on a magnitude relationship between the first and second likelihoods, (7) repeating the above steps (3)

to (6), and (8) eliminating an initial process in which a change in the parameter is intense and distributing the (hyper) parameters.

FIG. 1 illustrates an example of a measurement system including a calculation processing device that calculates a feature amount by substituting, into a probability density function having the feature amount obtainable based on the detection signal described above as a random value, signal intensity at a plurality of positions included in a scanning region or the feature amount obtained at a plurality of positions on a sample, and obtaining a variable at which the probability density function is at the maximum or at which prescribed conditions are met.

In the example of FIG. 1, a scanning electron microscope 101 that is an imaging system and a calculation processing device 105 (pattern measurement device 102) that performs a measurement process based on a detection signal are connected to each other via a network, but the example is not limited thereto, and for example, the image processing unit 218 included in the scanning electron microscope illustrated in FIG. 2 may perform a calculation process described later. The system illustrated in FIG. 1 includes an SEM 101, the pattern measurement device 102 that performs measurement of a pattern or the like based on an obtained signal, and a design data storage medium 103 that stores design data of a semiconductor device or layout data generated according to the design data.

The pattern measurement device 102 transmits SEM image data obtained by the SEM 101 to a memory 106 that is an image storage device. The calculation processing device 105 performs following operations using the stored image data as input data.

An image processing unit 107 performs various image processes and measurement processes, such as obtaining a signal intensity profile in a certain direction, for example, a direction perpendicular to a pattern edge, or the like, from an image, extracting pattern edge coordinates therefrom according to a predetermined algorithm, calculating a pattern dimension or extracting a contour line indicating a pattern outline from a plurality of pattern edge coordinates extracted as such, calculating the deviation or a pattern feature by further comparing the pattern dimension or outline with the design data stored in the design data storage medium 103, and the like. A necessary processing result is stored in the memory 106.

A statistical model input unit 108 defines or selects a statistical model, represents the statistical model in an equation, and defines the probability density function as in an embodiment below. A statistical processing unit 109 calculates the probability density function that is most likely to provide an entire processing result output from the image processing unit 107, or a parameter or hyper parameter thereof.

A result processing unit 110 displays the obtained calculation result on, for example, a display device of an input device 104.

According to the measurement system described above, highly accurate estimation is possible from a small number of samples by performing physical/empirical assumption regarding spatial distribution or temporal change. Accordingly, even when highly-accurate/highly reproducible measurement using an electron beam is used, it is possible to control/manage various manufacturing devices and manufacturing processes with high production accuracy within a practical time range, improve production yields of various semiconductor devices and electronic components, and improve performance thereof.

Hereinafter, more specifically, a pattern feature amount measurement device that performs a measurement process based on a detection signal or the like obtained by a charged particle beam device such as SEM, a computer program that causes a calculation processing device (computer) to perform the measurement process, and a storage medium that stores the computer program are described.

Embodiment 1

In the current embodiment, details about specific processes for determining a position of an edge that is a type of a feature amount are described. In the current embodiment, "a signal intensity profile congruent in a direction perpendicular to an average edge for all edge points" is assumed as a physical model with the signal intensity distribution as a random variable, and the signal intensity distribution that is most likely is determined. FIG. 3 illustrates a rough process flow.

First, using a scanning electron microscope as illustrated in FIG. 2, secondary electrons and backscattered electrons from a sample are detected by scanning a surface of the sample with a focused electron beam at constant current and scanning speed. The detection signal intensity distribution $I(x, y)$ is obtained from a relationship between detection intensity and an electron beam incident position. Since the current and scanning speed are constant, an average incident electron number per pixel is constant. Here, for convenience, a sample having a step extending in a y-direction was observed as the sample. A step edge position varies in an x-direction by so-called LER. The detection signal intensity distribution $I(x, y)$ is transmitted to the image memory 220 or the memory 106.

The image processing unit 107 receives image data stored in an image storage device, calculates a signal intensity profile in a direction perpendicular to an edge at a plurality of y coordinate positions along the edge of the step pattern, and stores the signal intensity profile in the image memory 220 or the memory 106.

Next, in the statistical model input unit 108, a random variable, a probability density function, and a parameter/hyper parameter are defined. Herein, the followings are set. First, the random variable is set to the detection signal intensity $\{I_{ij}\}$ (i=1 to m, j=1 to N) at each pixel. Here, $I_{ij}=I(x_i, y_j)$, wherein $x_i, y_j$ are x, y coordinates of a pixel (i, j).

Next, a probability density function P having the detection signal intensity distribution $\{I_{ij}\}$ as a random variable is defined as $P=\Pi_{ij} p_{ij}(I_{ij})$ (here, $\Pi_{ij}$ is a product regarding all pairs of i and j). $p_{ij}$ denotes a probability for obtaining the detection signal intensity $I_{ij}$ at the pixel (i, j) (i=1 to m, j=1 to n) (element probability density function for each pixel).

The element probability density function is defined as a normal distribution, such as $p_{ij}=N(I_{ij}|I_x(x_i-x_e(y_j)), \sigma_x(x_i-x_e(y_j)))$, with respect to the detection signal intensity $I_{ij}$ for each pixel obtained as described above. N is the normal distribution.

Here, $I_x(x)$ denotes the ideal signal intensity distribution (depending only on an x coordinate) when an edge extending in a y-direction is at an origin of an x-axis. Here, "ideal" means a limit value approaching when an electron beam irradiation amount is increased if a sample does not change by electron beam irradiation. Herein, a profile when a frame number is increased is used, but a simulation result or the like may also be used. Also, $x_e(y)$ is defined as a hyper parameter at an x coordinate of an x-direction edge at a y-direction coordinate y. An x-direction edge position at an edge position y may be estimated by obtaining an average value of the xe(y) distribution for each y.

σx(x) denotes a standard deviation of the signal intensity distribution Ix(x) caused by a particle nature of electrons, and is defined as a hyper parameter. In the above, P is represented as the probability density function having the detection signal intensity distribution {Iij} as the random variable, and xe(y) and σx(x) as hyper parameters. Also, herein, the probability density function is the normal distribution N, but another function type may be used. For example, the signal intensity distribution may be obtained as a digital signal by discretely counting a signal electron number. In this case, the element probability density function for the detection signal intensity Iij for each pixel may be Poisson distribution. The statistical model input unit 108 sets other various parameters necessary for an MCMC method.

Next, the statistical processing unit 109 specifies the density probability function and the hyper parameters. In particular, from the detection signal intensity distribution I(x, y) stored in the image memory 220 or the memory 106, and the probability density function P defined by the statistical model input unit 108, distributions of each hyper parameter of the probability density function are obtained using the above method and MCMC method, and average values and standard deviations thereof are calculated. As a result, xe(yj) and σx(xi) are determined such that P(I(x, y) x, y) is the maximum for all combinations of x and y. In the current embodiment, although Ix(x) is provided as a known function such as an analytical solution or the like with respect to an average value of a plurality of measurement results or an ideal edge, Ix (x) itself may also be an unknown function and obtained as a hyper parameter.

Also, in the current embodiment, an edge position is obtained by calculating an average value of distribution of edge positions (xe(y)) at which the probability density function P(I(x, y) x, y) having signal intensity at each position in a scanning region as a random variable is the maximum, but the edge position (xe(y) at which P satisfies predetermined condition) at which the probability density function P(I(x, y) x, y) is, for example, equal to or greater than a predetermined threshold value, or is equal to or greater than the predetermined threshold value and satisfies another condition may be obtained.

The result output unit 110 displays the average value as the estimated position of the edge on the display device of the input device 104, or the like. A typical output result is illustrated in FIG. 4. An upper left column of FIG. 4 is a diagram illustrating a relationship between a coordinate position of an edge portion obtained according to an SEM image and luminance (signal intensity). Also, an upper right column shows an outline of a statistical model. In the current embodiment, two pieces of distribution information of variation distribution of an edge position in the x-direction and the variation distribution of signal intensity are stored as the statistical model, so as to estimate a true edge position using the two pieces of distribution information. Accordingly, the two pieces of distribution information are displayed as the upper right column to be visually determined. Measurement results (the luminance distribution information obtained from the actual SEM image) and the estimated true edge positions obtained based on the statistical model as such are shown, for example, in a lower column of FIG. 4. In addition, when it is difficult to be progressed or to perform a calculation in the MCMC method, the intent thereof (error message) may be displayed. Further, not only the estimated edge position information, but also measurement results may be displayed by performing dimension measurement or EPE measurement between the plurality of estimated edge positions.

Embodiment 2

Next, an example in which a feature amount estimation method using a statistical model is used to measure a dimension of a pattern or the like or to calculate wafer in-plane distribution is described. In Embodiment 1, the detection signal intensity distribution in the scanning region is set as the random variable, whereas in the current embodiment, the dimension distribution in a wafer is set as a random variable and the most likely dimension distribution in a wafer is determined by assuming that, as a physical model, "the dimension (CD) distribution in the wafer or random variation (LCDU) distribution thereof each follow an independent function".

In the current embodiment, first, by using the scanning electron microscope illustrated in FIG. 2, an SEM image is captured according to a predetermined method with respect to a plurality of regions including n representative points (2-dimensional coordinate positions ri, i=1 to n) pre-set on a wafer substrate including elements and circuit patterns on a surface. The captured SEM image is transmitted to the image memory 220 or the memory 106. Here, the plurality of regions include the same design patterns (in other words, patterns theoretically having the same dimensions and same shapes).

The image processing unit 107 measures a dimension CDi(i=1 to n) of the same design patterns included in a captured region with respect to data of each SEM image according to a pre-set predetermined recipe based on input of data of a plurality of SEM images stored in the image memory 220 or the memory 106, and stores a measurement result in the image memory 220 or the memory 106. In the current embodiment, an example in which the calculation is performed using the dimension value CDi as the feature amount of the pattern is described, but an index value indicating another pattern dimension or shape may be used as the feature amount. For example, types of the feature amount include a shape, area, index value of roughness, and the like of the pattern.

Next, the statistical model input unit 108 defines a random variable, a probability density function, and a parameter/hyper parameter. Followings are set in the current embodiment. The random variable is set to a dimension {CDi} at each measurement position on a wafer substrate. A probability density function P having the dimension {CDi} as the random variable is defined as P=Π_i pi(CDi) (here, Π_i is a product regarding i). pi denotes a probability for obtaining the dimension CDi at a position ri (an element probability density function). The element probability density function for the dimension CDi at the position ri is defined as a normal distribution, such as pi=N (CDi CDmean (ri), LCDU (ri)) (N denotes normal distribution). CDmean(ri) and LCDU(ri) denote a distribution model using wafer coordinates as a function. Here, ri=(Xi, Yi)=(Ri, ei) denotes 2-dimensional wafer coordinates.

Here, CDmean(ri) and LCDU(ri) developed respectively to CDmean(ri)=Σ_j Aj φj(ri) (here, Σ_j denotes a sum regarding j) and LCDU(ri)=Σ_j Bjφj(ri), as functions of wafer coordinates. Since φj(ri) is a two-dimensional orthogonal polynomial system and a wafer and a chamber shape of a process device are generally circular, herein, a Zernike polynomial system is used with ri as a polar coordinate system (Ri, θi).

Also, the distribution of CDmean or LCDU reflects the distribution of conditions or states of the process device, such as etching, CVD, CMP, and the like, for example, the distribution of shapes, temperatures, gas pressures, electric potentials, or the like of the wafer or a chamber, stage, or the like of the process device. The distributions are well expressed in the Zernike polynomial system, but are not limited thereto, and another distribution model may be used.

From the above, P may be expressed as the probability density function having the dimension {CDi} as a random variable, and Aj and Bj as hyper parameters. Also, herein, the normal distribution N is used as the element probability density function, but another function form may be used.

The statistical model input unit 108 sets other various parameters necessary for the MCMC method.

Next, the statistical processing unit 109 calculates, from the dimension data {CDi} stored in the image memory 202 or the memory 106 and the probability density function defined in the statistical model input unit 108, each of the hyper parameters {Aj} and {Bj} of the probability density function, and also the distributions of CDmean and LCDU obtained from each of {Aj} and {Bj}, using the method described in the section on the means and the MCMC method. In particular, for example, Aj and Bj are determined such that $P=\Pi_i\, pi\, (CDi)$ is the maximum for all 2-dimensional coordinate positions ri. In addition, Aj and Bj may be determined such that P is, for example, equal to or greater than a predetermined threshold value, or is equal to or greater than the predetermined threshold value and satisfies another condition. Furthermore, average values and standard deviations of CDmean and LCDU at each position are calculated. The widths of CDmean distribution and LCDU distribution obtained via repetition of the MCMC method are a CD value at each point on the wafer and an index value indicating measurement reproducibility of LCDU.

Figure 5B:
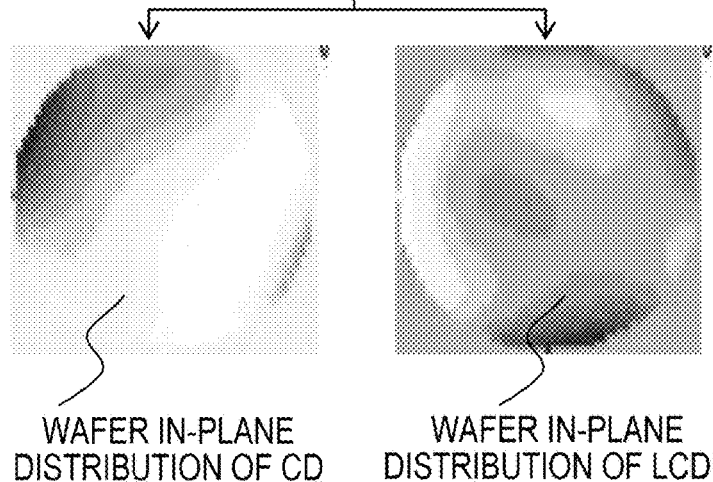
Figure 5C:
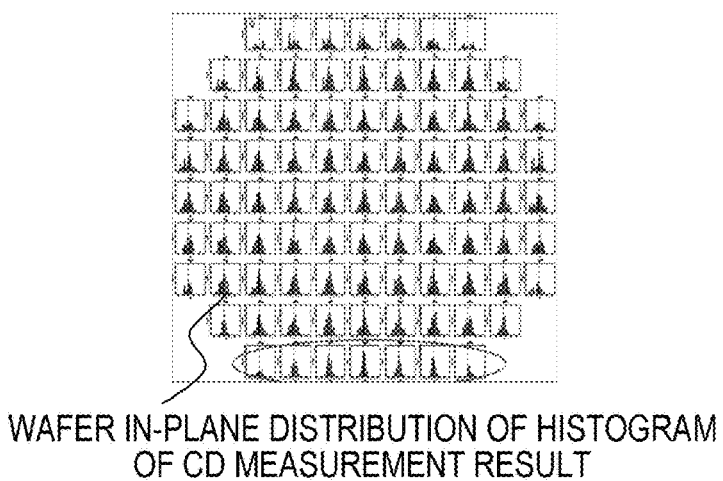

The result output unit 110 displays the average value on the display device of the input device 104, or the like. A typical output is illustrated in FIG. 5. FIG. 5(a) illustrates the distribution of measurement points on the wafer. Further, FIG. 5(b) illustrates display examples of in-plane distribution of CD values and in-plane distribution of LCDU, which are obtained based on sampling of CD values at each measurement point and the statistical processing. In the in-plane distribution of CD values, identification display (for example, color display) is performed according to the magnitude of measurement value. Also, FIG. 5(c) illustrates an example of displaying a histogram showing the variation of measurement results in each chip on the wafer or each shot unit. In addition, when it is difficult to be progressed or to perform a calculation in the MCMC method, the intent thereof (error message) may be displayed.

In the above embodiment, the distribution in the wafer is modeled by the Zernike polynomial, but an exposure device and mask-induced distribution may be added to the model. For example, CDmean and LCDU are developed as $CDmean(ri)=\Sigma Aj\,\phi j(ri)+\Sigma ak\,\Psi k(rc\_i)$, $LCDU(ri)=\Sigma Bj\phi j(ri)+\Sigma bk\,\Psi k(rc\_i)$ respectively as functions of wafer coordinates and chip coordinates. rc_i is the coordinates in a chip of a measurement point at the position ri (coordinates in an exposure area). Since the exposure area is rectangular, $\Psi k(rc\_i)$ is a two-dimensional orthogonal polynomial system, and since the exposure area is rectangular, 2-dimensional Legendre polynomial system is used herein with rc_i as an orthogonal coordinate system (xi, yi). Furthermore, an offset term per chip, the distribution per chip, or the like may be added. As such, by separating the distribution in the wafer and the distribution in the chip, the wafer process, such as etching, depositing, CMP, developing/washing, or the like may be monitored from the former, and the exposure process and the state of the mask may be monitored from the latter, thereby further controlling the device state or process conditions.

Also, the probability density function other than the normal distribution, for example, double/triple Gaussian or the like may be assumed to apply a function, such as $pi=N1\,(CDi|CDmean\_1(ri),\, LCDU\_1(ri))+N2\,(CDi|CDmean\_2(ri),\, LCDU\_2(ri))+\ldots$.

Also, in the above embodiment, the dimension CD of the same design pattern is measured from the captured SEM image data, but in recent CD-SEM, it is possible to obtain an image including a pattern of two different layers constituting LSI and measure misalignment OVL between the two layers. Accordingly, by substituting the CD in the above embodiment with OVL, it is possible to obtain wafer in-plane distribution OVL(ri) of the misalignment and the variation thereof in the exact same manner.

Furthermore, it is possible to estimate the distribution of the EPE in the wafer plane in combination with CDmean(ri), LCDU(ri), or OVL(ri) estimated in the current embodiment, or the measured result of misalignment in the wafer plane measured by another measurer as necessary. Accordingly, it is possible to improve the yield by predicting chip yield distribution in the wafer plane and feeding back to a setting condition of the process device or the like as necessary.

Since CDmean(ri), LCDU(ri), and OVL(ri) are random variables, EPE that is the function thereof may also be defined as a random variable. Thus, according to the current embodiment, it is possible to more accurately predict the yield by obtaining the probability density distribution function of EPE.

Embodiment 3

When the variation progresses temporally, so-called Bayes estimation may be applied. That is, for example, it is assumed that a result $\{CDi\,(t+\Delta t)\}$ is obtained by obtaining a probability density function p(t) at a time t via the method described in Embodiment 2, and then performing observation at a time $t+\Delta t$. In this case, a probability density function $P(t+\Delta t)$ at the time $t+\Delta t$ may be obtained from $P(t+\Delta t,\{CDi\})=\Pi\_i\, N(CDi(t+\Delta t)|CDmean(t,\,ri),\,LCDU(t,\,ri))P(t,\{CDi\})$. As such, by updating the probability density function with the lapse of time and applying the probability density function as the prior probability distribution as illustrated in FIG. 6, the process of change may be accurately grasped without performing measurement on a large number of points.

Embodiments 1 and 2 above correspond to a case where uniform probability distribution is assumed for a prior distribution. Generally, a result having higher reliability is obtained when a previous measurement result is applied than when the uniform probability distribution is assumed for the prior distribution, but it may be preferable to assume the uniform probability distribution after feedback is provided to the process device or the like.

REFERENCE SIGNS LIST

101: scanning electron microscope (SEM)
102: pattern measurement device
103: design data storage medium
104: input device
105: calculation processing device
106: memory 107: image processing unit
108: statistical model input unit
109: statistical processing unit
110: result output unit
201: electron source
202: lead electrode
203: electron beam
204: condenser lens
205: scanning deflector
206: objective lens
207: sample chamber
208: sample stage
209: sample
210: accelerated electron
211: secondary electron
212: conversion electrode
213: detector
214: control device

The invention claimed is:

1. A pattern measurement system comprising;
a manufacturing device;
a electron beam scanner;
a pattern measurement device for recognizing pattern dimension distribution of a wafer in a semiconductor integrated circuit during the wafer manufacturing process, wherein the pattern measurement device comprises
a calculation processing device for measuring index values indicating dimensions or shapes of patterns of a plurality of points on a sample from a signal obtained through the electron beam scanner, wherein the calculation processing device:
acquires a signal intensity distribution from a scanning electron microscope for a plurality of positions included in a scanning region from a signal obtained through electron beam scanning,
substitutes the signal intensity distribution based on the signal obtained through the electron beam scanner into a probability density function having the signal intensity distribution as a random variable and coordinates within the scanning region as a variable and including a parameter indicating deviation of an edge position formed on a sample and a parameter indicating deviation of the signal intensity of charged particles emitted from the edge,
sets the coordinates within the scanning region at which the probability density function is at the maximum or at which prescribed conditions are met as an edge position, for the plurality of positions within the scanning region, and
uses the probability density function to obtain the semiconductor integrated circuit dimensions, and using the semiconductor integrated circuit dimensions to control the manufacturing device.

2. The pattern measurement system according to claim 1, wherein the calculation processing device sets a hyper parameter based on the coordinates in the scanning region.

3. The pattern measurement system according to claim 2, wherein the calculation processing device sets the random variable, the probability density function, and the hyper parameter as a statistical model.

4. The pattern measurement system according to claim 3, wherein the calculation processing device sets the following arithmetic expressions as the statistical model:
$P = \Pi\_{ij}\ p_{ij}$, wherein $\Pi\_{ij}$ is a product regarding all pairs of i and j,
$p_{ij} = N(I_{ij} | I_x(x_i - x_e(y_j)), \sigma_x(x_i - x_e(y_j)))$, where, P denotes a probability density function,
$p_{ij}$ denotes an element probability density function for each pixel indicating a probability of obtaining detection signal intensity $I_{ij}$,
N denotes normal distribution,
$I_{ij}$ denotes detection signal intensity distribution,
$I_x$ denotes ideal signal intensity when an edge extending in a y-direction is at an origin of an x-axis,
$x_e(y)$ denotes an x coordinate of an x-direction edge at a y-direction coordinate y,
$\sigma_x(x)$ denotes a standard deviation of signal intensity distribution, and
$x_i$ and $y_j$ respectively denote x, y coordinates of a pixel (i, j).

5. A pattern measurement apparatus comprising:
a pattern measurement device configured to cooperate with a manufacturing, device and with an electron beam scanner the pattern measurement device also being configured to recognize pattern dimension distribution of a wafer in a semiconductor integrated circuit during the wafer manufacturing process, comprising:
a calculation processing device for measuring index values indicating dimensions or shapes of patterns of a plurality of points on a sample from a signal obtained through by the electron beam scanner, the calculation processing device also acquiring signal intensity distribution for a plurality of positions included in a scanning region,
wherein the calculation processing device:
sets a statistical model including a probability density function that includes a distribution model indicating distribution of the index value within a surface of a wafer using a function of a hyper parameter and coordinates as a parameter and uses the index value as a random variable,
substitutes the index value obtained through the measurement into the statistical model,
calculates the hyper parameter at which the probability density function is at the maximum or at which prescribed conditions are satisfied at the plurality of points,
calculates the distribution model at a plurality of positions based on setting of the obtained hyper parameter in the statistical model,
uses the probability density function to obtain the semiconductor integrated circuit dimensions, and
use the semiconductor intergrated circuit dimensions to control the manufacturing device.

6. The pattern measurement apparatus according to claim 5, wherein the index value indicates a dimension or shape of a pattern obtained through the beam scanning.

7. The pattern measurement apparatus according to claim 5, wherein the calculation processing device calculates an average value and a standard deviation of the distribution model.

8. The pattern measurement apparatus according to claim 5, wherein the calculation processing device sets the following arithmetic expressions as the statistical model:
$P = \Pi\_i\ p_i(CD_i)$, wherein $\Pi\_i$ is a product regarding i,
$p_i = N(CD_i | CDmean(r_i), LCDU(r_i))$,
where, P denotes a probability density function,
$p_i$ denotes an element probability density function indicating a probability of obtaining a dimension $CD_i$ at a position $r_i$,
N denotes normal distribution,
$CD_i$ denotes a value of a dimension of a pattern, CDmean denotes a model indicating distribution of values of dimensions in a sample, and LCDU denotes a model indicating a variation in dimensions in a sample.

9. The pattern measurement apparatus according to claim 1, wherein a true edge position is estimated by using two types of the signal intensity distribution.

10. The pattern measurement apparatus according to claim 5, wherein a true edge position is estimated by using two types of information of the distribution model.

11. The pattern measurement apparatus according to claim 5, wherein the distribution model indicating distribution of the index value within a surface of a wafer is a Zernike polynomial system.

* * * * *